United States Patent [19]
Roberts

[11] Patent Number: 5,099,219
[45] Date of Patent: Mar. 24, 1992

[54] FUSIBLE FLEXIBLE PRINTED CIRCUIT AND METHOD OF MAKING SAME

[75] Inventor: Joseph A. Roberts, Hudson, N.H.

[73] Assignee: Rock, Ltd. Partnership, Nashua, N.H.

[21] Appl. No.: 662,256

[22] Filed: Feb. 28, 1991

[51] Int. Cl.[5] .................................. H01H 85/04
[52] U.S. Cl. ............................ 337/297; 29/623; 337/4
[58] Field of Search ............... 337/297, 1, 4, 142, 337/145, 295, 290; 29/623, 829, 832, 837, 846, 847

[56] References Cited

U.S. PATENT DOCUMENTS

| | | |
|---|---|---|
| 3,875,542 | 4/1975 | Holland et al. |
| 4,089,734 | 5/1978 | Bierig. |
| 4,246,563 | 1/1981 | Noerholm. |
| 4,272,753 | 6/1981 | Nicolay ............... 337/297 |
| 4,357,750 | 11/1982 | Ostman ............... 29/847 |

FOREIGN PATENT DOCUMENTS 2136386 2/1973 Fed. Rep. of Germany ...... 337/297

Primary Examiner—Harold Broome
Attorney, Agent, or Firm—Hale and Dorr

[57] ABSTRACT

A fusible flexible printed circuit includes one or more conductors extending along a flexible dielectric substrate. Each conductor is comprised of a layer of electrically conductive material and a layer of fusible material extending along part or all of said conductive layer. One or more gaps is formed in the conductive layer at location opposite a segment of the fusible layer so that electrical current flowing through each conductor is required to pass in its entirety through the layer of fusible material at the location of each gap in the layer of conductive material. The integral fuses are designed to specific electrical parameters and may be located randomly along circuit runs. Preferably, the circuit is reinforced at the locations of the fuses by metal support strips designed to minimize motion stress on the fuses and the fuses are sealed within bubbles in a protective overlay which capture debris when the fuses are blown. The use of such a circuit to incorporate a variety of fuses having different fuse ratings into the conductive paths of a flexible printed circuit is also disclosed, as is a method of making the fusible circuit.

24 Claims, 3 Drawing Sheets

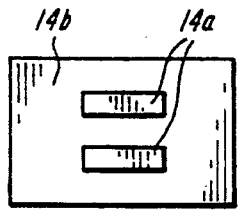 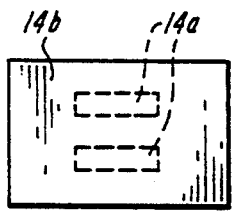 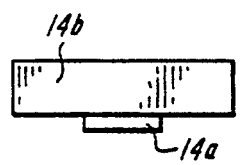 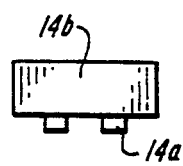
FIG. 4A　　　FIG. 4B　　　FIG. 4C　　　FIG. 4D
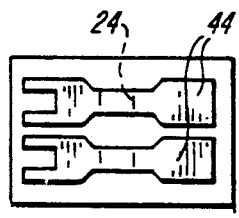 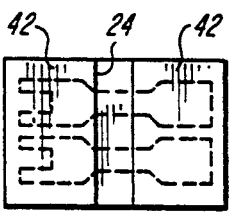 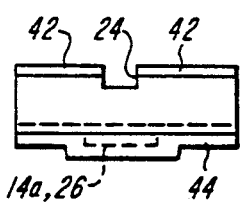 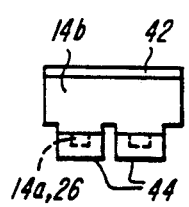
FIG. 5A　　　FIG. 5B　　　FIG. 5C　　　FIG. 5D
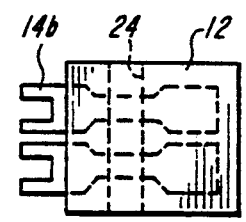 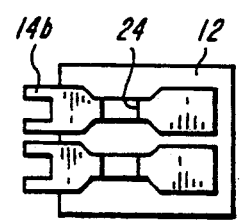 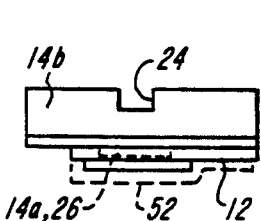 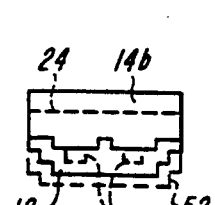
FIG. 6A　　　FIG. 6B　　　FIG. 6C　　　FIG. 6D

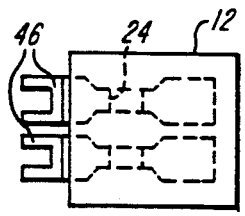 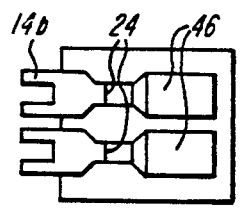 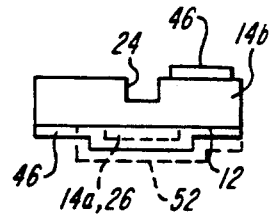 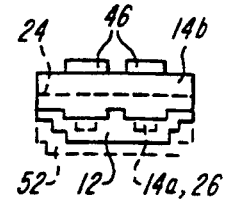
FIG. 7A     FIG. 7B     FIG. 7C     FIG. 7D
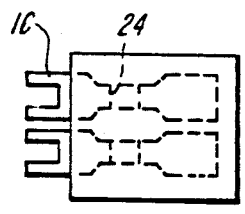 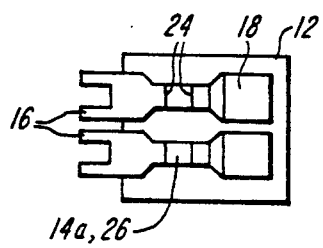 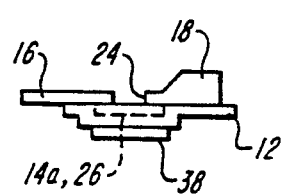 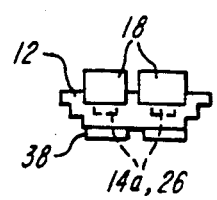
FIG. 8A     FIG. 8B     FIG. 8C     FIG. 8D
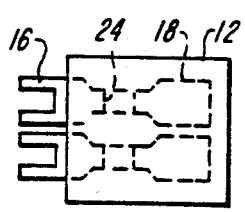 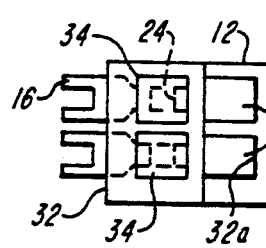 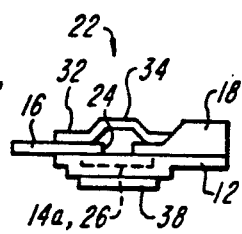 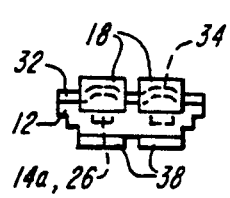
FIG. 9A     FIG. 9A     FIG. 9A     FIG. 9A

FUSIBLE FLEXIBLE PRINTED CIRCUIT AND METHOD OF MAKING SAME

This invention relates to flexible printed circuit. It relates more particularly to a circuit of this type which incorporates integral fuses at selected locations along the circuit conductors.

BACKGROUND OF THE INVENTION

In today's competitive electronics market, manufacturers are placing additional emphasis on reducing direct labor costs and increasing product reliability. This emphasis is easily understood when it is realized that today's manufacturers purchase all of their components and most of their subassemblies from outside suppliers. Their main task is to assemble and interconnect all components and subassemblies found within their product. The majority of these components are still interconnected using wire. However, a growing trend is the use of flexible printed circuits for such interconnections.

Each such circuit is custom designed to a specific length, current carrying capacity and geometric shape to fit the package. This circuit is, in fact, an engineered component and, as such, can be incorporated into volume assembly techniques as are other components. Flexible printed circuits are easily tested and quickly connected with no chance of wiring errors. For these reasons, the circuits are gaining wide acceptance with today's electronic manufacturers.

In an electrical circuit, it is desirable to have fuses at selected locations in the circuit runs in order to protect various electrical components from power surges. This is particularly so in the case of flexible printed circuits which establish electrical connections between many different components and subassemblies of electrical equipment such as data processing apparatus, communications apparatus, power supplies, diode amplifiers, etc.

Conventionally, such fuses are incorporated into the printed circuit as separate components or multiple fuse modules which must be connected electrically and mechanically to the circuit. However, prior fuses and fuse modules are relatively large and, as the conductor paths of printed circuits have become finer and more closely spaced, it has become increasingly more difficult to incorporate these fusible elements into the circuitry. It would be desirable, therefore, to provide a better way of incorporating fuses into flexible printed circuits.

SUMMARY OF THE INVENTION

Accordingly, the present invention aims to provide a flexible printed circuit having integral fuses present at selected locations along the circuit conductors.

Another object of the invention is to provide an improved fusible fine line printed circuit.

A further object of the invention is to provide a fusible flexible printed circuit which is resistant to motion stress during fabrication and installation.

Another object is to provide a flexible printed circuit with integral fuses whose fuse ratings can be set precisely.

Still another object of the invention is to provide a fusible flexible printed circuit which is relatively easy and inexpensive to make.

Another object is to provide a fusible printed circuit which confines the fusing debris.

A further object of the invention is to provide a method of making fusible flexible printed circuits having one or more of the above advantages.

Other objects will, in part, be obvious and will, in part, appear hereinafter.

The invention accordingly comprises the sequence of steps and the features of construction, combination of elements and arrangement of parts which will be exemplified in the following detailed description, and the scope of the invention will be indicated in the claims.

Briefly, our printed circuit includes conductors which are mounted to and meander along a suitable electrically insulating substrate. The substrate is flexible so that the circuit can function as a harness or interconnect.

Our circuit differs from the usual flexible printed circuit, however, in that one or more of its conductors or runs incorporates an integral fuse. Each fusible conductor or run is a bimetallic structure comprising a first layer of a suitable electrically conductive material and an integral second layer of a suitable fusible material. Each integral fuse is designed to specific electrical parameters (i.e. length, width, thickness) and may be located at any random position along a given run. At the location of each fuse, one or more gaps is formed in the conductive layer so that electrical current through that run is required to pass in its entirety through the layer of fusible material at the location of each gap in the conductive layer. To form the fuses, the conductive layer segments of the printed circuit can be omitted or removed by chemical milling or etching techniques. Thus, the resistive characteristics of those fuses and their fuse ratings can be controlled quite precisely.

Preferably, each fuse along a run is supported not only by the circuit's insulating substrate, but also by an underlying metal support strip to be described in more detail later which minimizes motion stress on that fuse during circuit fabrication and/or assembly, and during the circuit's useful life in the field. That strip also constitutes a heat sink allowing close control over the associated fuse's fusing characteristics during an overload condition.

Desirable also, the circuit has an insulating cover or overlayer formed with integral bubbles or domes over the circuit fuses. These bubbles encapsulate and protect the fuses and provide controlled spaces for the fuses to blow clean so as to minimize damage to and contamination of adjacent circuit runs Further, if desired, the circuit runs can be provided with integral terminating areas or pads which are raised above the insulating overlayer to protect the electrical integrity of the pads by eliminating the possibility of glue flow to those pads and to facilitate component placement and attachment to the flexible circuit.

The present invention is applicable even to fine-line printed circuits whose conductive paths are quite narrow and densely packed on the substrate. As will be described in more detail later, our fusible circuits are relatively easy and inexpensive to make and they provide a quick and convenient means for incorporating integral fuses into the otherwise unfused conductor runs or paths of a flexible printed circuit. The invention thus enhances the quality of fusible flexible circuits, while materially reducing the cost of such circuits.

BRIEF DESCRIPTION OF THE DRAWINGS

For a fuller understanding of the nature and objects of the invention, reference should be had to the following detailed description, taken in connection with the accompanying drawings, in which:

FIGS. 4A to 9D are diagrammatic views illustrating the steps followed to make to the FIG. 1 circuit.

DESCRIPTION OF THE PREFERRED EMBODIMENT

Figure 1:
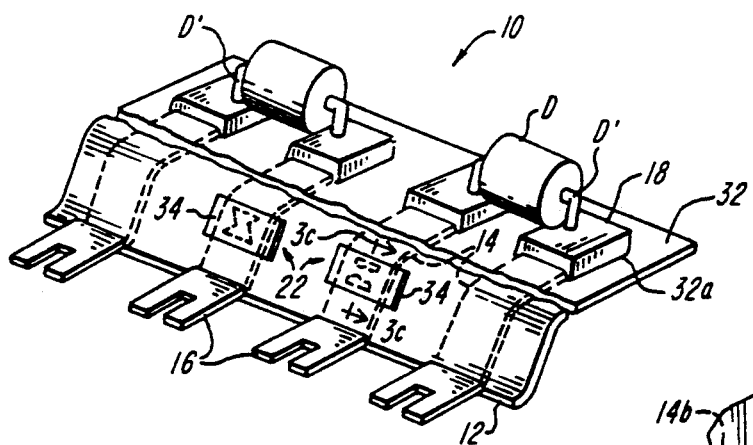
FIG. 1 is a fragmentary isometric view of a fusible flexible printed circuit made in accordance with our invention.

Referring to FIG. 1 of the drawings, a flexible printed circuit incorporating our invention is indicated generally at 10. Circuit 10 comprises a flexible dielectric substrate 12 of the type commonly used in the manufacture of flexible printed circuits. Extending along the surface of substrate 12 is one or more conductive runs or paths 14. For ease of illustration, we have shown these runs as being relatively large and widely spaced. In actuality, they may be fine line conductors on the order of only 0.005 inch wide.

In a typical flexible circuit or interconnect, there may be many such conductive paths 14 extending more or less in parallel the entire length of the circuit 10. Typically, these conductive paths lead to terminals or pads at the opposite ends of the circuit which establish electrical connections between paths 14 and the terminals of electrical components, PC boards, modules or the like. In the illustrated circuit 10, the runs 14 connect bayonet-type terminals 16 suitable for coupling to mating terminals on a PC board and raised terminating areas or pads 18 suitable for mounting, say, a diode.

In accordance with this invention, selected circuit runs 14 are formed with integral fuses shown generally at 22 at selected locations along their lengths. If any one of the fused paths 14 of circuit 10 is exposed to excessive current, the fuse 22 in that path will fuse or break, thereby interrupting current flow along that path. The remaining paths 14 of circuit 10 will be unaffected and will continue to carry current between the components and circuits to which the circuit 10 is connected.

Figure 2:
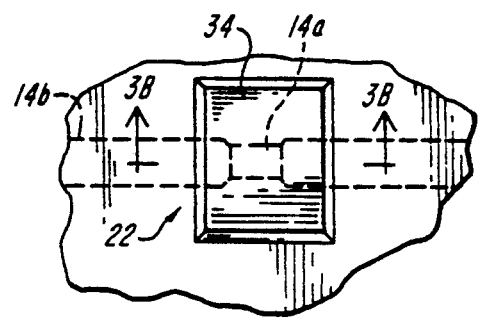
FIG. 2 is a fragmentary plan view on a much larger scale showing a fusible portion of the FIG. 1 circuit.
Figure 3A:
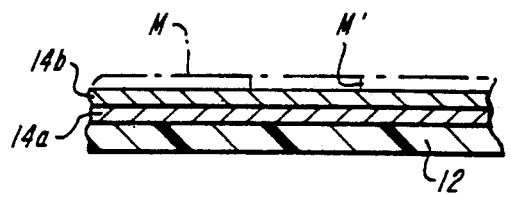
FIG. 3A is a sectional view showing a typical bimetallic circuit conductor before a fuse is formed therein by creating a gap in the conductive layer of the circuit.
Figure 3B:
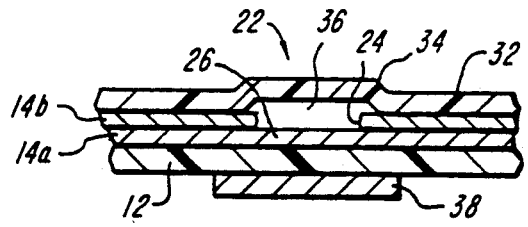
FIG. 3B is a sectional view along line 3B—3B of FIG. 2 showing a circuit conductor incorporating an integral fuse.

Referring now to FIGS. 2 and 3B, at least at the locations of fuses 22, each circuit path 14, instead of being a single conductive layer as in a conventional printed circuit, is a bimetallic structure. In other words, each run or path 14 includes a first layer 14a next to substrate 12 of a fusible material such as a lead-zinc alloy and a second layer 14b on layer 14a consisting of an electrically conductive material such as copper metal. The two layers 14a and 14b may extend in superposition along the entire length of each circuit path 14, although in actuality, layer 14a only has to be present at the locations of the fuses 22.

The dimensions of the upper or outer conductive layer 14b are selected so that layer 14b by itself can carry the current that will normally flow in path 14. In a typical circuit, for example, layer 14b may be on the order of 0.001 inch high and 0.005 inch wide. The fusible underlayer 14a may be more or less the same width as layer 14b. Its height or thickness, however, is selected to provide a layer cross-section that will yield the fuse rating desired for the particular fuse 22. A typical thickness for a lead-zinc alloy layer 14a is 0.0002 to 0.001 inch.

The fused conductive paths 14 of circuit 10 can be formed using the very same imaging and etching or chemical milling techniques customarily used to make printed circuits, one such method being disclosed in U.S. Pat. No. 4,357,750. In this case, of course, since each path 14 has a bimetallic segment, two imaging and etching sequences may be required to form the two conductor layers 14a and 14b in each such segment.

Also in accordance with conventional procedures, the conductor layers can be layed down directly on substrate 12 or the bimetallic circuit paths can be etched from a bimetallic sheet and subsequently be adhered or bonded to substrate 12. Also, of course, in the case of gross or wide line circuits, the paths 14 can simply be stamped mechanically from a bimetallic sheet.

The circuit paths 14 may be made fusible at the fuses 22 along their lengths simply by omitting or removing the conductive layer 14b from those segments. This may be accomplished by masking the circuit at segments 16, one such mask being indicated in phantom at M in FIG. 3A. The mask has a window M' that exposes each circuit path segment 16 so that the portion of layer 14b exposed in the mask window can be milled or etched away without damaging or attacking the underlying fusible layer. Most preferably, however, the fuses 22 are made by the method steps described in connection with FIGS. 4A to 9D.

In any case, as shown in FIGS. 2 and 3B, the removal of the layer 14b material at each fuse 22 leaves a gap 24 in the conductive layer of the run 14 which registers with a segment 26 of the underlying layer 14a of fusible material. Thus, in the area of gap 24, all of the current carried by that run 14 is routed through fusible metal segment 26. Therefore, by properly controlling the cross-section of segment 26, that segment can be made to have a selected current-carrying capacity or rating. Since the segment 26 can be dimensioned very accurately when the circuit 10 is being printed, the fuse rating can be controlled precisely. If that capacity should be exceeded, the segment 26 will blow or melt, thereby creating a gap or open circuit in the associated path 14 so that that path will no longer conduct current between the terminals 16 and 18 of that path. For example, in FIG. 1, the right hand fuse 22 has blown creating a gap G in the righthand circuit run 14.

Figure 3C:
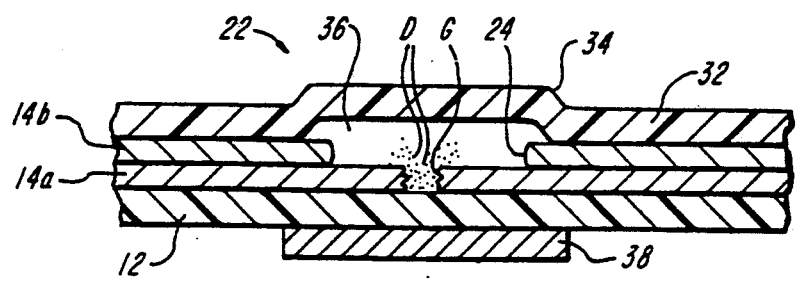
FIG. 3C is a similar view on a larger scale taken along line 3C—3C of FIG. 1 showing a blown fuse.

As best seen in FIGS. 3B and 3C, circuit 10 preferably includes an overlayer 32 of flexible dielectric material which overlies conductors 14. Overlayer 32 may be of the same material as substrate 12 and be laminated or adhered to substrate 12 and the conductors. Desirably in this event, overlayer 32 is formed with bubbles or domes 34 over the various fuses 22. These bubbles or domes perform several functions. First, they, and the air entrapped within, act as shock absorbers to shield the fuses 22, which are the weakest parts of circuit 10, from impact forces. Secondly, the bubbles provide some structural support and insulation for the fuses 22. In addition, they protect the fuses 22 from chemical and mechanical damage. The bubbles or domes 34 also provide controlled hermetically sealed voids or spaces 36. These spaces will capture and confine any carbon debris and gases, shown at D in FIG. 3C, generated when a segment 26 of the fusible layer 14a, blows or melts due to excessive current passing through that segment. But for the presence of the bubbles 34, gases and debris could blow out and damage or contaminate adjacent circuit paths. The bubbles also allow fuses 22 to blow "clean" minimizing carbon traces and current leakage.

To minimize motion stress on the fuses 22 in circuit 10 during manufacture of the circuit and afterwards, the circuit may also include metal reinforcing or stabilizing strips 38 under the fuses 22 as shown in FIGS. 3B and 3C. These strips are applied to the underside of the circuit substrate 12 early on in the manufacturing process. Strips 38 protect the fusible layer 14a all during the manufacturing process and they may remain on the circuit 10 for its useful life. The metal strips 38 also constitute heat sinks under the fuses 22 allowing the manufacturer of circuit 10 to maintain very close control over the fusing characteristic of the various fuses 22 during an overload condition.

Refer now to FIGS. 4A to 9D which illustrate a preferred method of making the FIG. 1 circuit 10. In the drawing figures, thicknesses have been exaggerated for clarity. Also, in the drawing figures, an A following the figure number indicates a bottom view, a B indicates a plan view and the letters C and D indicate side and end views, respectively.

As shown in FIGS. 4A to 4D, first fusible metal layers 14a are applied (e.g., plated, inlaid or pressure fused) to conductive metal layer 14b at those locations where fuses 22 are to be formed in circuit 10.

The particular metal of layer 14a is selected for its current carrying capacity and other characteristics to accommodate the type of fuse desired, e.g. slow-blow, standard, surge, etc.

Next, as seen in FIGS. 5A to 5D, the resulting bimetallic structure is coated with a top resist coating 42 and a bottom resist coating 44 and etched to define the fuse gap 24 (FIGS. 5B and 5C) and the conductor pattern (FIG. 5A). Once defined, each conductor is developed by etching from both faces to a depth equal to the approximate thickness of the conductor pattern.

Then, after removing the resist coatings 42 and 44, the dielectric substrate 12 is laminated to the undersides of fusible layers 14a and the conductive layer 14b as shown in FIGS. 6A to 6D. If the circuit is to include the metal stabilizing strips 38 under fuses 22, the substrate should be a composite including a metal underlayer 52, e.g. of copper, as shown in phantom in FIGS. 6C and 6D. Thus, layer 52 provides support for the relatively small thin fusible metal layers 14a.

There is now a second imaging step to protect the terminal areas of layer 14b and to deepen the fuse gap 24. For this, a resist coating 46 is applied over the areas of layer 14b corresponding to terminals 16 and the terminal pads 18 as shown in FIGS. 7A to 7D. After a second etch and removal of the resist coating according to FIGS. 8A to 8D, the definitions and reduction in thickness of the conductors 14 and the definition of the fuse gap are complete. Note from FIGS. 8C and 8D that the terminal pads 18 at the ends of the conductor runs 14 have more or less the same thicknesses as the original conductive layer 14b shown in FIGS. 4A to 4D.

Also, if the circuit is to include the metal stabilizing strips 38, the metal layer 52 is etched to shape the strips 38 as shown in FIGS. 8C and 8D so that they stabilize and support the fuses 22 without restricting circuit 10 flexibility. The strips may have a variety of different shapes. For example, they may be rectangular as shown in those figures or the adjacent strips may be joined by a web of metal to form a single large H-shaped metal structure under the fuses which constitutes an efficient heat sink.

The final step in the process of making circuit 10 is to laminate the overlayer 32 to the upper face of the composite structure as shown in FIGS. 9A to 9D. First, however, holes 32a are provided in the overlayer to provide clearance for terminal pads 18. Also, the overlayer is vacuum formed or molded to create the bubbles 34.

As the fuses 22 are arranged on conductive layer 14b, so the bubbles 34 are located on overlayer 32 so that when the overlayer is registered to that layer and laminated to it using a pre-shaped template (not shown), the bubbles 34 will be located precisely over fuses 22. When the circuit 10 is completed, the terminal pads 18 project above, (e.g. 0.001 to 0.025 inch) overlayer 32 so that they can serve as mounting pedestals for circuit components as shown in FIG. 1.

The exiting terminals 16, on the other hand, are quite thin and may or may not be supported by one or the other of substrate 12 and overlayer 32. In other words, one of those layers, e.g. substrate 12, may extend beyond the other layer under terminals 16 to provide support for those terminals.

Note that when circuit 10 includes the stabilizing strips 38, those strips maintain the integrity of the fine line fuse segments 26 as they proceed through the process of making circuit 10 until they are completely entrapped by the dielectric layers 12 and 32 and thereafter. Since those layers stabilize the fuse segments, strips 38 may then be removed if desired for one reason or another.

Of course, various applications of our invention may be envisioned. For example, a circuit similar to circuit 10 may be programmed to establish connections only between chosen conductors of that circuit. To accomplish this, a fusing current is applied to the paths 14 of the circuit not chosen that will blow the fuses 22 connected to those paths. In this way, those paths of the circuit not chosen can be broken or open-circuited, leaving the chosen paths of the circuit intact.

It will thus be seen that the objects set forth above, among those made apparent from the preceding description, are efficiently attained, and, since certain changes may be made in the above method and in the above construction without departing from the scope of the invention, it is intended that all matter contained in the above description or shown in the accompanying drawings be interpreted as illustrative and not in a limiting sense.

It is also to be understood that the following claims are intended to cover all of the generic and specific features of the invention herein described.

I claim:

1. A fusible flexible circuit comprising a flexible dielectric substrate; one or more bimetallic electrical circuit paths adhered to said substrate at least one of said paths being a fused path comprised of a layer of electrically conductive material and a layer of fusible material extending along at least part of said layer of conductive material, and means defining a gap in said layer of conductive material at one or more selected locations therealong whereby electrical current flowing along each of said fused paths is conducted primarily through said conductive material layer except at the location of each said gap where it is conducted solely through said fusible material layer.

2. The circuit defined in claim 1 wherein said substrate is laminated to the conductive material layer of each of said fused paths.

3. The circuit defined in claim 2 and further including a dielectric layer laminated to the fusible material layer of each of said fused paths.

4. The circuit defined in claim 3 and further including a window in said dielectric layer directly opposite each said gap in the electrically conductive layer of each of said fused paths.

5. The circuit defined in claim 3 and further including a small noncontacting bubble formed in one of said substrate and said dielectric layer opposite each said gap.

6. The circuit defined in claim 3 and further including a metal reinforcing strip laminated to s id substrate opposite each said gap.

7. A fusible flexible circuit including a flexible electrically insulating sheet substrate; a plurality of bimetallic electrical conductors mounted to said substrate in spaced-apart relation, each said conductor comprising a layer of electrically conductive material and a layer of fusible material in intimate electrical contact with and extending along at least part of said conductive layer between said conductive layer and said substrate; means defining one or more gaps in said conductive layer, each said gap being located opposite a segment of said fusible layer so that electrical current flowing through each conductor is conducted primarily through said layer of conductive material except at the location of each said gap in the layer of conductive material where it is conducted solely through said layer of fusible material.

8. The circuit defined in claim 7 and further including electrical insulating material laminated to the exposed surfaces of said substrate and said conductors except at said one or more gaps so that a bubble is present in the electrical insulating material opposite each said gap.

9. The circuit defined in claim 7 and further including a metal reinforcing strip laminated to said substrate opposite each said gap.

10. The circuit defined in claim 7 and further including terminals at the ends of said conductors.

11. The circuit defined in claim 10 wherein at least some of said terminals are raised above said conductors.

12. The method of making a fusible flexible printed circuit comprising the steps of forming a flexible dielectric substrate, and forming at least one flexible conductive path of the printed circuit on the substrate as a bimetallic conductor, said bimetallic conductor having a layer of conductive material and a layer of fusible material extending in a superimposed relation along part or all of said layer of conductive material.

13. The method defined in claim 12 and including the additional step of forming a gap at one or more selected locations along said layer of conductive material, each said gap being located opposite a segment of the layer of fusible material.

14. The method defined in claim 13 and including the additional step of laminating a layer of flexible electrically insulating material to the conductive paths and the substrate except at the areas thereof at each gap so that a nonadherent bubble is present in said layer opposite each gap.

15. The method defined in claim 13 and including the additional step of laminating a metal reinforcing strip to said substrate opposite each said gap.

16. The method defined in claim 15 wherein said strip is shaped to support and stabilize the fusible material layer opposite the corresponding gap during flexing or vibration of the circuit.

17. The method defined in claim 15 wherein each said strip is shaped to provide a heat sink under the fusible material layer at the corresponding gap.

18. The method of making a flexible printed circuit having at least one integral fuse comprising the steps of
applying at least on fusible metal strip to one face of a conductive metal sheet to form a bimetallic structure;
applying resist coatings to said structure to define the locations of a fuse gap at said one face of said sheet which crosses said fusible strip and a conductor pattern on the opposite face of said sheet, a segment of which is aligned with said fusible strip;
etching the structure to form the fuse gap and conductor pattern;
removing the resist coatings;
laminating a flexible dielectric substrate to said fusible strip and the adjacent surfaces of said conductor pattern;
chemically milling said conductor pattern to define terminal areas of said conductor pattern and to deepen said fuse gap to the level of each said fusible strip to form a fuse thereat.

19. The method defined in claim 18 and including the additional step of applying a metal layer to the underside of said substrate to stabilize each said fusible strip during manufacture of the circuit.

20. The method defined in claim 19 wherein said metal layer is applied prior to said chemical milling step.

21. The method defined in claim 20 and including the additional step of removing selected portions of said metal layer so as to define a selectively shaped metal support strip under each said fusible strip.

22. The method defined in claim 21 and including the additional step of removing the support strip under at least one fusible strip.

23. The method defined in claim 20 and including the additional step of adhering a dielectric covering to the exposed surfaces of said conductors except in the terminal areas thereof.

24. The method defined in claim 23 and including the step of forming a nonadhering bubble in said covering over each said fuse.

* * * * *